United States Patent
Kang et al.

(10) Patent No.: US 9,349,978 B2
(45) Date of Patent: May 24, 2016

(54) ORGANIC LIGHT EMITTING DISPLAY DEVICE AND METHOD OF MANUFACTURING THE SAME

(71) Applicant: Samsung Display Co., Ltd., Yongin, Gyeonggi-Do (KR)

(72) Inventors: Ki-Nyeng Kang, Yongin (KR); Na-Young Kim, Yongin (KR); Dong-Gyu Kim, Yongin (KR); Soo-Beom Jo, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 338 days.

(21) Appl. No.: 13/827,231

(22) Filed: Mar. 14, 2013

(65) Prior Publication Data
US 2014/0103304 A1    Apr. 17, 2014

(30) Foreign Application Priority Data
Oct. 17, 2012    (KR) .......................... 10-2012-0115610

(51) Int. Cl.
*H01L 51/52* (2006.01)
*H01L 27/32* (2006.01)

(52) U.S. Cl.
CPC ........ *H01L 51/5203* (2013.01); *H01L 27/3279* (2013.01)

(58) Field of Classification Search
CPC .................. H01L 2924/0002; H01L 2924/00; H01L 29/04; H01L 29/66765; H01L 29/78696; H01L 27/3276; H01L 29/41733; H01L 29/6675; H01L 33/0058; H01L 27/1288; H01L 27/3232; H01L 21/02532; H01L 21/0262

USPC .......................... 438/158, 159, 160, 166, 34; 257/E21.414, 59, E27.121, E29.004, 257/E33.001, E33.064, 43, 57

See application file for complete search history.

(56) References Cited

U.S. PATENT DOCUMENTS

| | | | | | |
|---|---|---|---|---|---|
| 5,685,949 | A | * | 11/1997 | Yashima | H01J 37/32082 134/1.1 |
| 5,812,403 | A | * | 9/1998 | Fong | B08B 7/0035 134/1.1 |
| 5,925,931 | A | * | 7/1999 | Yamamoto | H01L 23/3114 257/737 |
| 6,326,299 | B1 | * | 12/2001 | Homma | C09G 1/02 257/E21.304 |
| 6,835,595 | B1 | * | 12/2004 | Suzuki | H01L 21/56 257/701 |
| 7,897,971 | B2 | * | 3/2011 | Kurokawa | H01L 27/0248 257/57 |
| 8,067,775 | B2 | * | 11/2011 | Miyairi | H01L 27/1225 257/72 |
| 8,188,477 | B2 | | 5/2012 | Miyairi et al. | |
| 8,227,278 | B2 | * | 7/2012 | Sasagawa | H01L 27/1214 257/E21.414 |

(Continued)

FOREIGN PATENT DOCUMENTS

| | | |
|---|---|---|
| KR | 10-2008-0056820 | 6/2008 |
| KR | 10-2010-0006419 | 1/2010 |

(Continued)

*Primary Examiner* — Stephen W Smoot
*Assistant Examiner* — Edward Chin
(74) *Attorney, Agent, or Firm* — Robert E. Bushnell, Esq.

(57) ABSTRACT

An organic light emitting display device including: a plurality of first wirings extending in a first direction; and a plurality of second wirings extending in a second direction that crosses the first direction, wherein at least one of the plurality of first wirings includes a first conductive layer and a second conductive layer that extends from an upper portion of the first conductive layer to the same layer as the first conductive layer or a lower layer than the first conductive layer.

20 Claims, 5 Drawing Sheets

(56) References Cited

U.S. PATENT DOCUMENTS

| | | | | |
|---|---|---|---|---|
| 8,324,738 B2* | 12/2012 | Liu | H01L 24/11 | |
| | | | 257/781 | |
| 8,366,953 B2* | 2/2013 | Kohno | C23C 16/4405 | |
| | | | 216/37 | |
| 8,384,079 B2* | 2/2013 | Yamazaki | G02F 1/136227 | |
| | | | 257/43 | |
| 2003/0194834 A1* | 10/2003 | Watase | H01L 23/3114 | |
| | | | 438/109 | |
| 2003/0221779 A1* | 12/2003 | Okuda | C23C 16/4405 | |
| | | | 156/345.26 | |
| 2004/0233141 A1* | 11/2004 | Matsumoto | G09G 3/3266 | |
| | | | 345/76 | |
| 2005/0012216 A1* | 1/2005 | Leong | H01L 23/49816 | |
| | | | 257/751 | |
| 2005/0252451 A1* | 11/2005 | Beppu | B08B 7/0035 | |
| | | | 118/719 | |
| 2010/0127265 A1* | 5/2010 | Kim | H01L 29/41733 | |
| | | | 257/59 | |
| 2010/0140610 A1 | 6/2010 | Lee et al. | | |
| 2011/0101527 A1* | 5/2011 | Cheng | H01L 24/11 | |
| | | | 257/738 | |
| 2011/0254161 A1* | 10/2011 | Hu | H01L 24/05 | |
| | | | 257/738 | |
| 2012/0032175 A1* | 2/2012 | Wang et al. | 257/59 | |
| 2012/0074423 A1 | 3/2012 | Kanegae | | |
| 2013/0194528 A1* | 8/2013 | Wang | G02F 1/13306 | |
| | | | 349/43 | |
| 2014/0319526 A1* | 10/2014 | Choi | H01L 29/41733 | |
| | | | 257/59 | |

FOREIGN PATENT DOCUMENTS

| | | |
|---|---|---|
| KR | 10-2010-0066929 | 6/2010 |
| KR | 10-2012-0059643 | 6/2012 |

* cited by examiner

ORGANIC LIGHT EMITTING DISPLAY DEVICE AND METHOD OF MANUFACTURING THE SAME

CLAIM PRIORITY

This application makes reference to, incorporates the same herein, and claims all benefits accruing under 35 U.S.C. §119 from an application earlier filed in the Korean Intellectual Property Office on 17 Oct. 2012 and there duly assigned Serial No. 10-2012-0115610.

BACKGROUND OF THE INVENTION

1. Field of the Invention

The present invention generally relates to an organic light emitting display device.

2. Description of the Related Art

An organic light emitting display device generally includes a thin film transistor (TFTsp electroluminescence device (hereinafter, referred to as an EL device) that may be driven by the thin film transistor (TFT) and displays an image.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides an organic light emitting display device that may reduce a resistance of a wiring.

The present invention also provides an organic light emitting display device that may reduce a parasitic capacitance.

According to an aspect of the present invention, there is provided an organic light emitting display device including: a plurality of first wirings extending in a first direction; and a plurality of second wirings extending in a second direction that crosses the first direction, wherein at least one of the plurality of first wirings includes a first conductive layer and a second conductive layer that extends from an upper portion of the first conductive layer to the same layer as the first conductive layer or a lower layer than the first conductive layer.

The first wirings and the second wirings may cross one another to define a plurality of pixels, and each of the plurality of pixels may include an organic light emitting device (OLED) including a pixel electrode, an intermediate layer including an organic emission layer, and an opposite electrode and a switching device including a gate electrode and source and drain electrodes, and the second conductive layer extends from the upper portion of the first conductive layer to a direction in which the second conductive layer may be far away from the opposite electrode.

As the second conductive layer gets farther away from the first conductive layer, the second conductive layer may extend to be far away from the opposite electrode.

The first wirings may be scan wirings that supply a scan signal to the pixels.

The organic light emitting display device may further include: a substrate; and a buffer layer disposed on the substrate, wherein the first wirings and the second wirings are formed on the buffer layer.

Parts of the second conductive layer may be formed on the buffer layer.

The organic light emitting display device may further include a first insulating layer formed between the buffer layer and the first conductive layer.

A first opening may be formed on the first insulating layer so that part of the second conductive layer contacts the buffer layer.

The organic light emitting display device may further include a second insulating layer disposed on the first insulating layer and covering the first conductive layer.

A second opening may be formed on the second insulating layer so that part of the second conductive layer contacts the buffer layer or the first insulating layer.

The first conductive layer and the second conductive layer may be connected to each other via a contact hole formed in the second insulating layer.

The second conductive layer may be disposed on the buffer layer by covering part of the first conductive layer.

The first conductive layer may be formed as the same layer as the gate electrode.

The first conductive layer may be formed of the same material as material used in forming the gate electrode.

The second conductive layer may be formed of the same material as material used in forming the source and drain electrodes.

The first conductive layer may include a plurality of sub-conductive layers that are formed to be spaced apart from each other by a predetermined distance.

Each of the plurality of sub-conductive layers may be connected to the second conductive layer.

The second conductive layer may cover part of each sub-conductive layer.

The second conductive layer formed between the plurality of sub-conductive layers may be disposed on the same layer as the plurality of sub-conductive layers or a lower layer than the plurality of sub-conductive layers.

According to another aspect of the present invention, there is provided an organic light emitting display device including: a plurality of pixels including an organic light emitting device (OLED) including a pixel electrode, an intermediate layer including an organic emission layer, and an opposite electrode and a switching device including a gate electrode and source and drain electrodes; a plurality of scan wirings connected to each of the plurality of pixels and supplying scan signals to the pixels; and a plurality of data wirings connected to each of the pixels and supplying data signals to the pixels, wherein at least one of the scan wirings includes a first conductive layer and a second conductive layer that extends from an upper portion of the first conductive layer to a direction in which the second conductive layer may be far away from the opposite electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
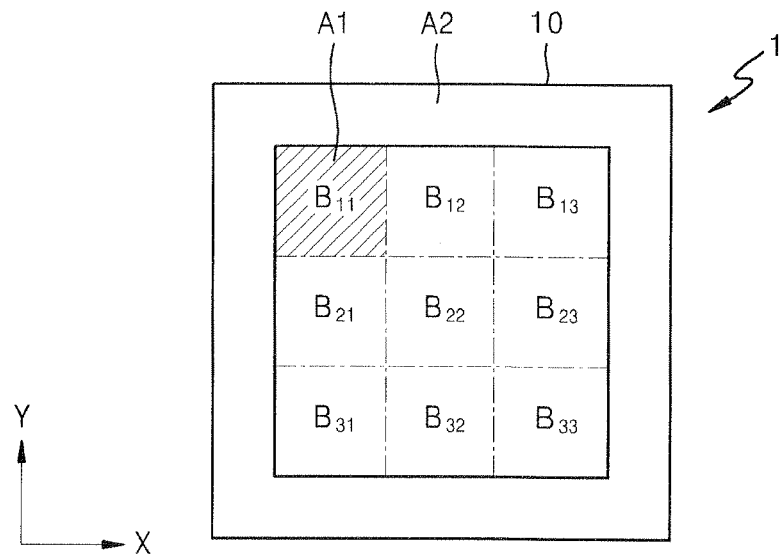
FIG. 1 is a schematic plan view of an organic light emitting display device according to an embodiment of the present invention.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Still further, when an element is described as being "far away" from another element this may indicate that the two elements are positioned within the structure with a significant physical distance between them and that intervening structures may or may not exist between these elements.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In an organic light emitting display device, the TFT has a structure in which a gate electrode, an active layer, and source and drain electrodes are stacked on a substrate. Thus, if a current is supplied to the gate electrode via a wiring arranged on the substrate, the current flows through the source and drain electrodes via the active layer, and simultaneously, the current flows through a pixel electrode of the EL device connected to the source and drain electrodes.

The EL device may include the pixel electrode, an opposite electrode that faces the pixel electrode, and an emission layer interposed between the pixel electrode and the opposite electrode. If a current flows through the pixel electrode via the TFT in the above structure, as described above, an appropriate voltage may be generated between the pixel electrode and the opposite electrode, and thus an emission operation may be performed by the emission layer so that an image can be displayed.

As the size of the organic light emitting display device increases, a resistance of a wiring, such as a gate wiring or a data wiring, increases, and as a parasitic capacitance increases, signal delay occurs.

Figure 2:
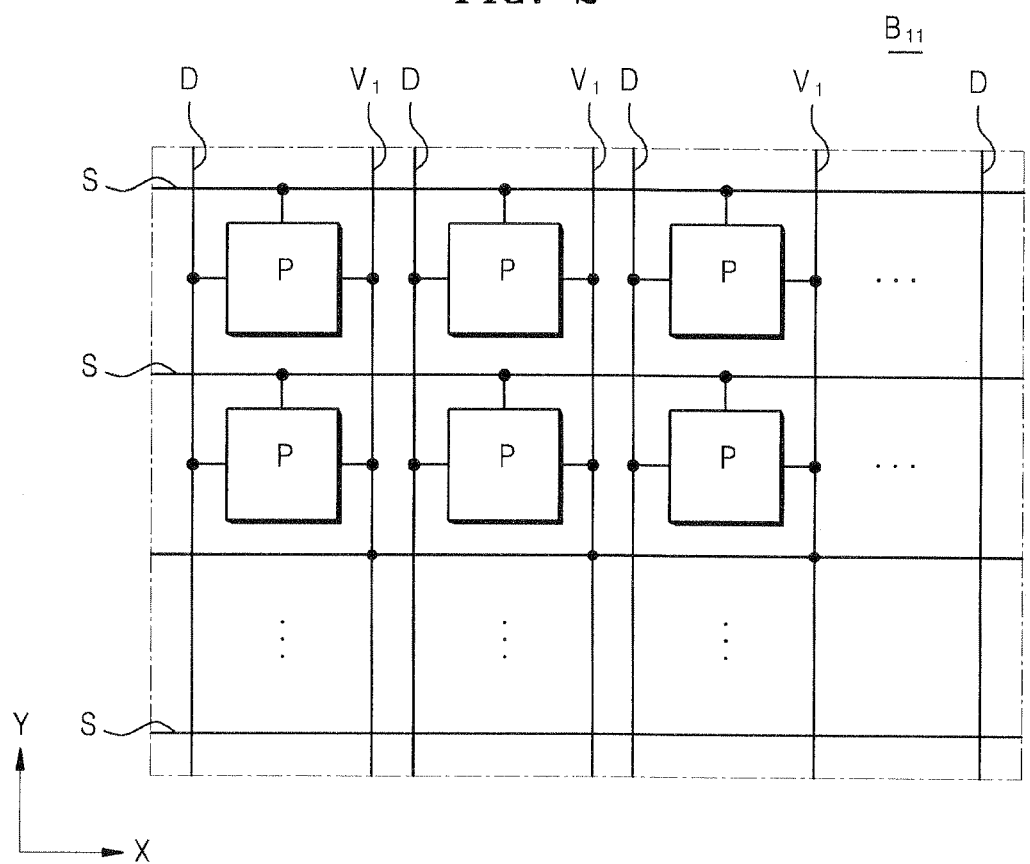
FIG. 2 is a view showing a schematic structure of a wiring of one pixel block of FIG. 1.

FIG. 1 is a schematic plan view of an organic light emitting display device 1 according to an embodiment of the present invention, and FIG. 2 is a view showing a schematic structure of a wiring of one pixel block of FIG. 1.

Referring to FIGS. 1 and 2, the organic light emitting display device 1 according to the present embodiment includes a display region A1 and a non-display region A2 that are indicated on a substrate 10.

The display region A1 in which an image may be displayed, may be indicated in a region including the center of the substrate 10, and the non-display region A2 may be arranged around the display region A1.

A plurality of pixels P in which an image may be displayed, are included in the display region A1.

Each of the plurality of pixels P may be defined as a scan wiring S that extends in a first direction X and a data wiring D that extends in a second direction Y perpendicular to the first direction X. The data wiring D applies a data signal provided by a data driving unit (not shown) disposed in the non-display region A2 to each pixel P, and the scan wiring S applies a scan signal provided by a scan driving unit (not shown) disposed in the non-display region A2 to each pixel P. Although, in FIG. 2, the data wiring D extends in the second direction Y and the second wiring S extends in the first direction X, aspects of the present invention are not limited thereto. That is, directions in which the data wiring D and the scan wiring S respectively extend, may be reverse.

Each pixel P may be connected to a first power supply line V1 that extends in the second direction Y. The first power supply line V1 applies a first power ELVDD (see FIG. 3) provided by a first power driving unit (not shown) disposed in the non-display region A2 to each pixel P. Although not shown in FIG. 2, each pixel P receives a second power ELVSS (see FIG. 3). Each pixel P controls a current amount that may be supplied to the second power ELVSS from the first power ELVDD via an organic light emitting device (OLED), in response to the data signal. Then, light having predetermined brightness may be generated from the organic light emitting device (OLED).

Figure 3:
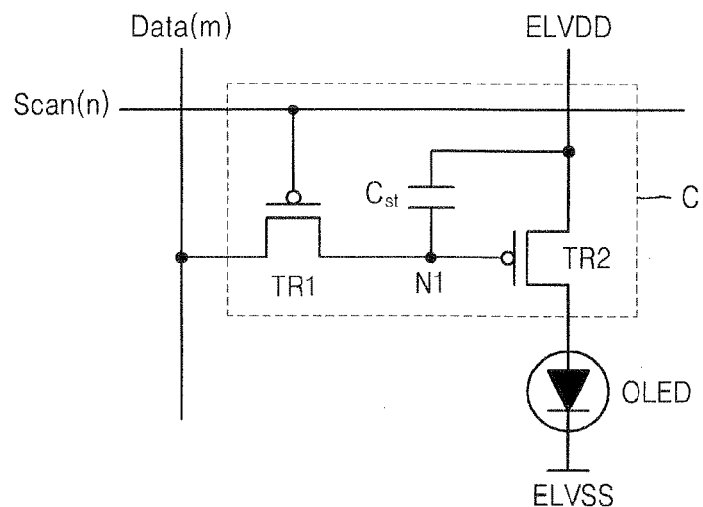
FIG. 3 is a circuit diagram of one pixel of FIG. 2.

FIG. 3 is a circuit diagram of one pixel of FIG. 2.

Referring to FIG. 3, a pixel includes the OLED and a pixel circuit C that supplies a current to the OLED.

A pixel electrode of the OLED may be connected to the pixel circuit C, and an opposite electrode (see 20 of FIG. 4) may be connected to the second power ELVSS. The OLED generates light having predetermined brightness in response to the current supplied by the pixel circuit C.

An active matrix type organic light emitting display device includes at least two transistors and at least one capacitor. In detail, the active matrix type organic light emitting display device includes a switching transistor for transmitting the data signal, a driving transistor for driving the OLED in response to the data signal, and a capacitor for maintaining a data voltage. Here, the number of TFTs and the number of capacitors are not limited thereto, and more TFTs 21 and 23 and more capacitors 22 may be disposed.

A gate electrode 214 of a first transistor TR1 may be connected to the scan wiring (see S of FIG. 2), a first electrode of the first transistor TR1 may be connected to the data wiring (see D of FIG. 2), and a second electrode of the first transistor TR1 may be connected to a first node N1. That is, a scan signal Scan(n) may be input to the gate electrode 214 of the first transistor TR1, and a data signal Data(m) may be input to the first electrode of the first transistor TR1.

The gate electrode 214 of a second transistor TR2 may be connected to the first node N1, a first electrode of the second transistor TR2 may be connected to the first power ELVDD, and a second electrode of the second transistor TR2 may be connected to the pixel electrode of the OLED. Here, the second transistor TR2 serves as a driving transistor.

A first capacitor $C_{st}$ may be connected between the first node N1 and the first electrode of the second transistor TR2, i.e., the first power ELVDD).

Figure 4:
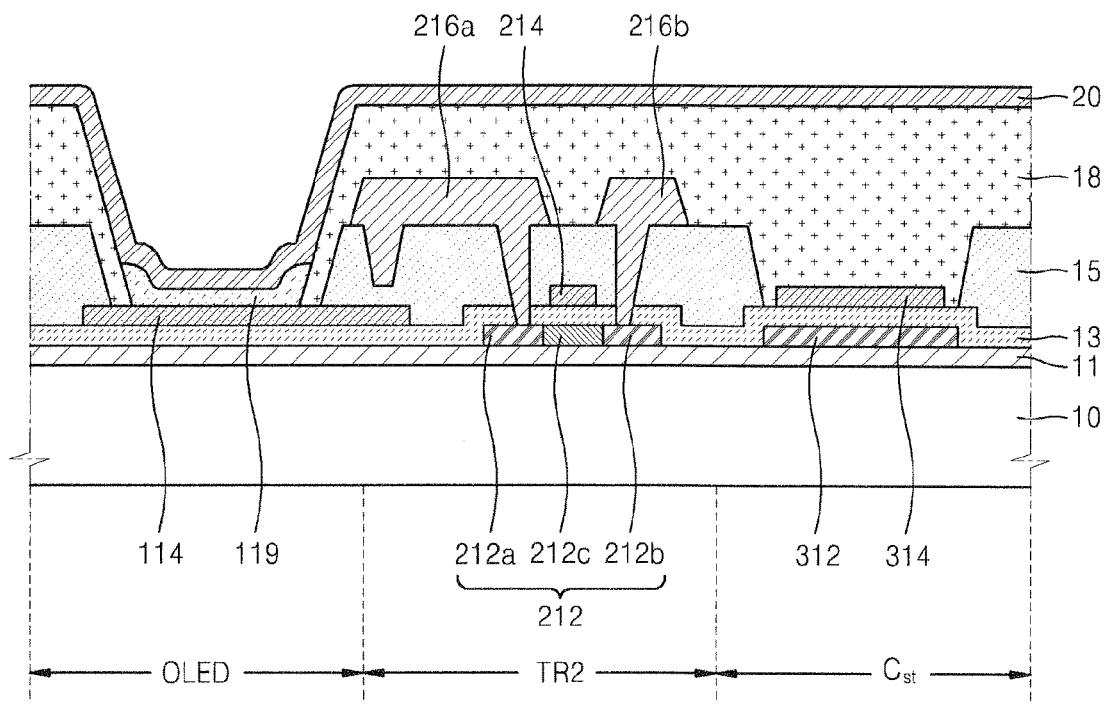
FIG. 4 is a schematic cross-sectional view of some elements of a pixel of the organic light emitting display device illustrated in FIG. 1.

FIG. 4 is a schematic cross-sectional view of some elements of the pixel of the organic light emitting display device 1 illustrated in FIG. 1.

Referring to FIG. 4, the second transistor TR2, the first capacitor $C_{st}$, and the OLED are disposed on the substrate 10.

The substrate 10 may be formed of a transparent glass material having a main ingredient of $SiO_2$. Material used in forming the substrate 10 is not limited thereto, and the substrate 10 may also be formed of a transparent plastic material. Also, the substrate 10 may be a flexible substrate. The flexible substrate 10 has a lower gravity than the glass substrate 10 and thus may be formed of a polymer material that is light-weight, is not well broken and is flexible, such as a flexible plastic film.

A buffer layer 11 may be further formed on the substrate 10. The buffer layer 11 may be formed of an inorganic material, such as SiOx, SiNx, SiON, AlO, or AlON, or an organic material, such as acryl or polyimide, or by alternately stacking an organic material and an inorganic material on the substrate 10. The buffer layer 11 blocks oxygen and moisture, prevents diffusion of moisture or an impurity generated in the substrate 10, and adjusts heat transfer speed so that crystallization of a semiconductor can be well performed.

The second transistor TR2 may be formed on the buffer layer 11. A thin film transistor according to the present embodiment may be a bottom gate type thin film transistor; however, a thin film transistor having another structure, such as a top gate type, may be disposed.

An active layer 212 may be formed on the buffer layer 11. When the active layer 212 may be formed of polysilicon, amorphous silicon may be formed and may be crystallized so as to be changed into polysilicon.

Various methods of crystallizing amorphous silicon, such as rapid thermal annealing (RTA), solid phase crystallization (SPC), eximer laser annealing (ELA), metal induced crystallization (MIC), metal induced lateral crystallization (MILC), and sequential lateral solidification (SLS) may be used; however, a method that does not require a high temperature heating process may be performed so as to apply the substrate 10 according to the present invention.

For example, when the semiconductor may be crystallized by using a low temperature poly-silicon (LTPS) process, activation of the active layer 212 may be performed by irradiating laser onto the substrate 10 for a short time, thereby removing time when the substrate 10 may be exposed to a high temperature of 300° C. or higher and performing the whole process at a temperature of 300° C. or less. Thus, the second transistor TR2 may be formed by applying the substrate 10 formed of a polymer material.

The active layer 212 includes a source region 212b and a drain region 212a formed by doping N-type or P-type impurity ions into the active layer 212. A region between the source region 212b and the drain region 212a may be a channel region 212c that may be not doped with an impurity.

A gate insulating layer 13 may be formed on the active layer 212. The gate insulating layer 13 has a single layer structure of $SiO_2$ or a double layer structure of $SiO_2$ and $SiN_x$.

A gate electrode 214 may be formed in a predetermined region of the gate insulating layer 13. The gate electrode 214 may be connected to a gate line (not shown) that applies a thin film transistor on/off signal. The gate electrode 214 may be formed as a single or multiple conductive layers.

A drain electrode 216a and a source electrode 216b are formed above the gate electrode 214. The drain electrode 216a and the source electrode 216b are respectively connected to the source region 212b and the drain region 212a of the active layer 212 in a state where an interlayer insulating layer 15 may be interposed between the drain electrode 216*a* and the source electrode 216*b* and the source region 212*b* and the drain region 212*a* of the active layer 212. The interlayer insulating layer 15 may be formed of an insulating material, such as $SiO_2$ or SiNx, or an insulating organic material.

A pixel-defining layer 18 may be disposed above the interlayer insulating layer 15 so as to cover the drain electrode 216*a* and the source electrode 216*b*. A pixel electrode 114 that may be formed of the same transparent conductive material as that of the gate electrode 214 may be formed above the buffer layer 11 and the gate insulating layer 13. Resistances of the drain electrode 216*a* and the source electrode 216*b* may be smaller than a resistance of the gate electrode 214.

The pixel electrode 114 may be formed by depositing metal having a small work function, i.e., Li, Ca, LiF/Ca, LiF/Al, Al, or Mg, and a compound thereof onto an intermediate layer 119 and by forming an auxiliary electrode by using a transparent electrode-forming material, such as ITO, IZO, ZnO, or $In_2O_3$. However, the pixel electrode 114 is not limited thereto and may be a reflective electrode.

An intermediate layer 119 may be formed on the pixel electrode 114 by etching part of the pixel-defining layer 18. The intermediate layer 119 includes at least an organic emission layer that emits visible rays.

An opposite electrode 20 as a common electrode may be formed on the intermediate layer 119. Voltages having different polarities are applied to the intermediate layer 119 so that the intermediate layer 119 emits light.

The organic emission layer of the intermediate layer 119 may be formed of a low molecular weight organic material or a polymer organic material.

When the organic emission layer of the intermediate layer 119 may be formed of a low molecular weight organic material, the intermediate layer 119 may be formed by stacking a hole injection layer (HIL), a hole transport layer (HTL), an organic emissive layer (EML), an electron transport layer (ETL), and an electron injection layer (EIL) in a single or multiple layer structure.

Also, organic materials that may be used in forming the intermediate layer 119 may be copper phthalocyanine (CuPc), N,N'-Di(naphthalene-1-yl)-N,N'-diphenyl-benzidine (NPB), and tris-8-hydroxyquinoline aluminum)(Alq3). These low molecular weight organic materials may be formed by vacuum deposition using masks.

When the organic emission layer of the intermediate layer 119 may be formed of a polymer organic material, the intermediate layer 119 may have a structure including a HTL and an EML. In this case, the HTL may be formed of PEDOT, and the EML may be formed of a poly-phenylenevinylene (PPV)-based and polyfluorene-based polymer organic material. These polymer organic materials may be formed by screen printing method or an inkjet printing method.

The intermediate layer 119 is not limited thereto, and various embodiments may be applied to the intermediate layer 119.

The opposite electrode 20 may be a transparent electrode like the pixel electrode 114, however, may be formed as a reflective electrode.

When the opposite electrode 20 is used as the transparent electrode, the opposite electrode 20 may be formed by depositing metal having a small work function, i.e., Li, Ca, LiF/Ca, LiF/Al, Al, or Mg, and a compound thereof onto the intermediate layer 119 and by forming an auxiliary electrode by using a transparent electrode-forming material, such as ITO, IZO, ZnO, or $In_2O_3$.

When the opposite electrode 20 is used as a reflective electrode, the opposite electrode 20 may be formed by depositing Li, Ca, LiF/Ca, LiF/Al, Al, or Mg, and a compound thereof onto the entire surface of the intermediate layer 119.

Although the pixel electrode 114 may be a transparent electrode, when the pixel electrode 114 is formed as a reflective electrode, the pixel electrode 114 may have a shape corresponding to the shape of an opening of each sub pixel. Although the opposite electrode 20 may be a transparent electrode, the opposite electrode 20 may be formed by depositing a reflective electrode onto the entire surface of a display region. The opposite electrode 20 may not necessarily be deposited onto the entire surface of the display region and may be formed in various patterns. In this case, the pixel electrode 114 and the opposite electrode 20 may be stacked on the substrate 10 so that their positions are opposite to each other.

In the organic light emitting display device according to the present embodiment, the pixel electrode 114 may be used as anode, and the opposite electrode 20 may be used as cathode. Of course, polarities of the pixel electrode 114 and the opposite electrode 20 may be opposite to each other. Although not shown in FIG. 4, a sealing member (not shown) may be disposed on the opposite electrode 20 so as to face one surface of the substrate 10.

A resistance of the scan wiring S may be reduced by depositing double conductive layers so that signal and voltage transmission may be easily performed.

Figure 5:
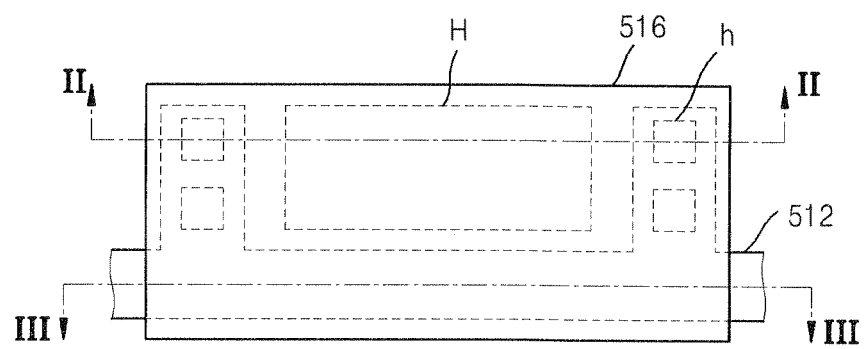
FIG. 5 is a plan view of part of a scan wiring corresponding to one pixel, according to an embodiment of the present invention.
Figure 6:
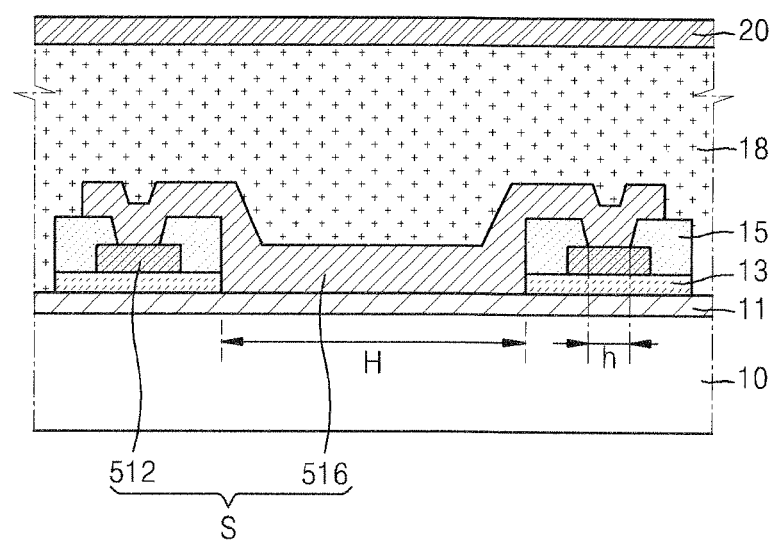
FIG. 6 is a cross-sectional view taken along a line II-II of FIG. 5.
Figure 7:
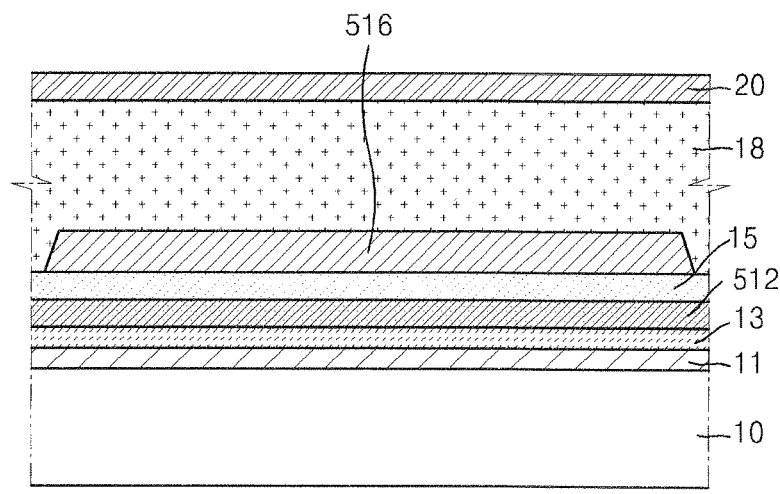
FIG. 7 is a cross-sectional view taken along a line III-III of FIG. 5.

FIG. 5 is a plan view of part of a scan wiring corresponding to one pixel, according to an embodiment of the present invention, FIG. 6 is a cross-sectional view taken along a line II-II of FIG. 5, and FIG. 7 is a cross-sectional view taken along a line III-III of FIG. 5.

Referring to FIGS. 5 through 7, the scan wiring S may be arranged on the buffer layer 11. In detail, the scan wiring S may include a first conductive layer 512 that may be disposed on the gate insulating layer 13, and a second conductive layer 516 that may be connected to the first conductive layer 512, extends from an upper portion of the first conductive layer 512 to the substrate 10 and may be disposed on the buffer layer 11.

For example, the first conductive layer 512 may be disposed on the gate insulating layer 13, and the second conductive layer 516 may extend from the upper portion of the first conductive layer 512 and may be disposed on the buffer layer 11. However, aspects of the present invention are not limited thereto. The second conductive layer 516 may also be disposed on the gate insulating layer 13. The second conductive layer 516 extends from the upper portion of the first conductive layer 512 to be far away from the opposite electrode 20. As the second conductive layer 516 gets farther away from the first conductive layer 512, the second conductive layer 516 may also be far away from the opposite electrode 20.

The first conductive layer 512 may be formed on the same layer as the gate electrode (see 214 of FIG. 4) by using the same material as material used in forming the gate electrode (see 214 of FIG. 4), and the second conductive layer 516 may be formed of the same material as material used in forming the source and drain electrodes (see 212*a* and 212*b* of FIG. 4).

The scan wiring S may be manufactured as follows.

The buffer layer 11, the gate insulating layer 13, and a conductive material are formed on the substrate 10. The above-described conductive material may be formed on the same layer as the gate electrode 214 by using the same material as material used in forming the gate electrode 214. By patterning the conductive material, the first conductive layer 512 may be formed.

Next, the interlayer insulating layer 15 may be deposited onto the gate insulating layer 13 so as to cover the first conductive layer 512. Then, a first opening h may be formed by etching the interlayer insulating layer 13 so that part of the first conductive layer 512 may be exposed, and a second opening H may be formed by etching the gate insulating layer 13 and the interlayer insulating layer 15 so that the buffer layer 11 may be exposed. The second opening H may be greater than the first opening h. Next, the first conductive layer 512 and the second conductive layer 516 that covers the first and second openings h and H are deposited. The second conductive layer 516 may be connected to the first conductive layer 512 via the first opening h, and part of the second conductive layer 516 may be formed on the buffer layer 11 that may be lower than the first conductive layer 512, via the second opening H. Since the first opening h connects the first conductive layer 512 and the second conductive layer 516, the first opening h may be referred to as a contact hole.

In this way, the first conductive layer 512 and the second conductive layer 516 are electrically connected to each other via the contact hole so that the entire resistance of the scan wiring S may be reduced and signal and voltage transmission may be easily performed. The contact hole may be one or more.

Also, due to the second opening H, part of the second conductive layer 516 may be formed lower than the first conductive layer 512 so that a distance between the opposite electrode 20 and the second conductive layer 516 may be increased. Thus, an increase in a parasitic capacitance between the opposite electrode 20 and the second conductive layer 516 may be suppressed. In order to maximize a reduction in the parasitic capacitance, the size of the second opening H may be a size at which as many second conductive layers 516 as possible may be formed on the second opening H.

Since the scan wiring S according to the present embodiment may be formed by combining the first conductive layer 512 and the second conductive layer 516, a region in which the first conductive layer 512 and the second conductive layer 516 overlap each other, may be minimized so that an increase in the parasitic capacitance may be suppressed.

Figure 8:
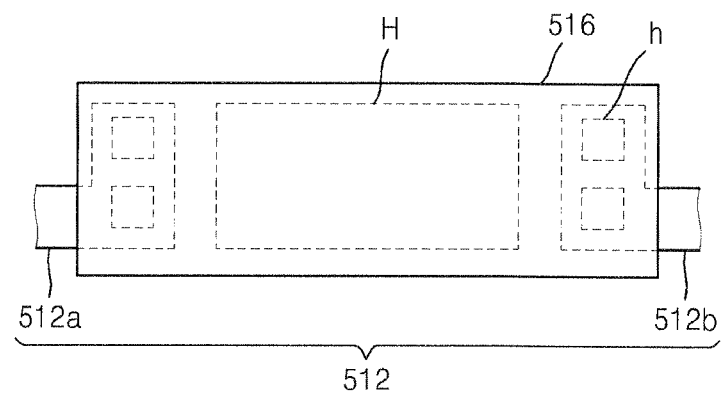
FIG. 8 is a plan view of part of a scan wiring corresponding to one pixel, according to another embodiment of the present invention.

FIG. 8 is a plan view of part of a scan wiring corresponding to one pixel, according to another embodiment of the present invention. As illustrated in FIG. 8, the first conductive layer 512 may include a first sub-conductive layer 512a and a second sub-conductive layer 512b that are formed on the gate insulating layer 13 to be spaced apart from each other by a predetermined distance. The second conductive layer 516 may be formed by connecting the first sub-conductive layer 512a and the second sub-conductive layer 512b. For example, the second conductive layer 516 may be formed by filling the first opening h and the second opening H of each of the first and second sub-conductive layers 512a and 512b.

The scan wiring S may be manufactured as follows.

The buffer layer 11, the gate insulating layer 13, and a conductive material are formed on the substrate 10. The conductive material may be formed on the same layer as the gate electrode 214 by using the same material as material used in forming the gate electrode 214. The conductive material may be patterned to form the first and second sub-conductive layers 512a and 512b.

Next, the interlayer insulating layer 13 may be deposited onto the gate insulating layer 13 so as to cover the first and second sub-conductive layers 512a and 512b. Then, the interlayer insulating layer 13 may be deposited onto each of the first and second sub-conductive layers 512a and 512b so that part of each of the first and second sub-conductive layers 512a and 512b may be exposed, thereby patterning the first opening h. In addition, the gate insulating layer 13 and the interlayer insulating layer 13 are etched so that the buffer layer 11 may be exposed, thereby forming the second opening H. The second opening H may be greater than the first opening h. Next, the second conductive layer 516 may be deposited to cover the first and second sub-conductive layers 512a and 512b and the first and second openings h and H. The second conductive layer 516 may be connected to the first and second sub-conductive layers 512a and 512b via the first opening h, and part of the second conductive layer 516 may be formed lower than the first and second sub-conductive layers 512a and 512b via the second opening H. In the present embodiment, the first conductive layer 512 includes two sub-conductive layers 512a and 512b. However, aspects of the preset invention are not limited thereto, and there may be three or more sub-conductive layers.

The size of the second opening H may be greater than the size of the second conductive layer 516 so that a reduction in the parasitic capacitance may be maximized.

Figure 9:
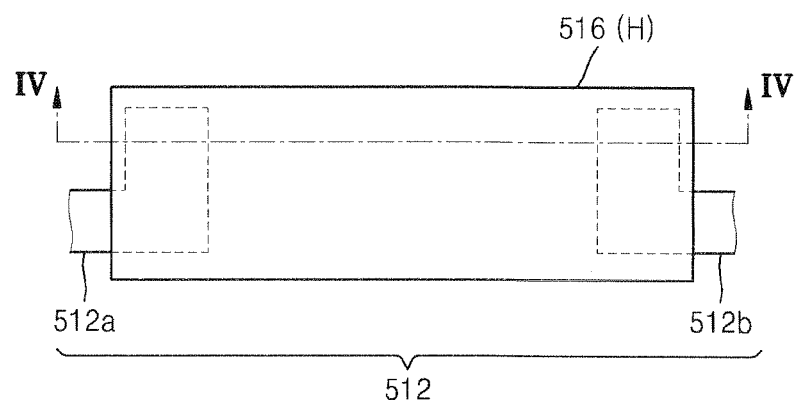
FIG. 9 is a plan view of part of a scan wiring corresponding to one pixel, according to another embodiment of the present invention.
Figure 10:
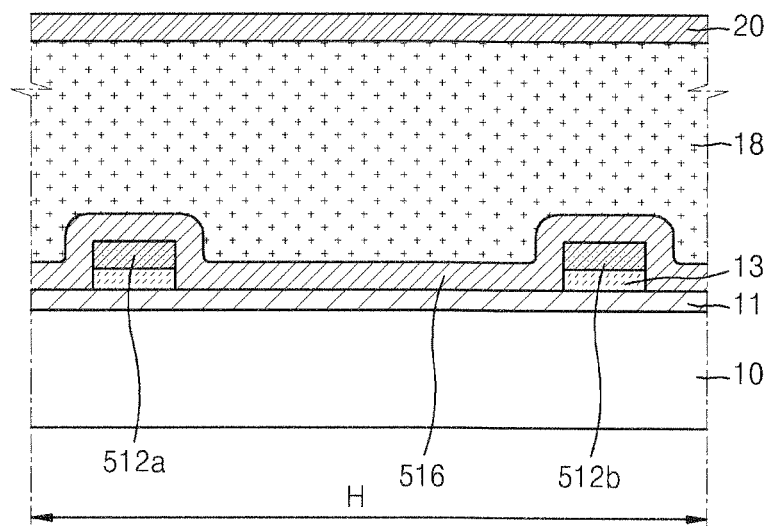
FIG. 10 is a cross-sectional view taken along a line IV-IV of FIG. 9.

FIG. 9 is a plan view of part of a scan wiring corresponding to one pixel, according to another embodiment of the present invention, and FIG. 10 is a cross-sectional view taken along a line IV-IV of FIG. 9.

As illustrated in FIGS. 9 and 10, the first conductive layer 512 may include a first sub-conductive layer 512a and a second sub-conductive layer 512b that are formed on the gate insulating layer 13 to be spaced apart from each other by a predetermined distance. Then, the gate insulating layer 13 and the interlayer insulating layer 13 are etched so that parts of the first sub-conductive layer 512a and the second sub-conductive layer 512b may be included in the first opening h. The second conductive layer 516 may be formed on the second opening H. Since parts of the first sub-conductive layer 512a and the second sub-conductive layer 512b are included in the second opening H and the second conductive layer 516 may be formed on the second opening H, the first opening h is not required to be formed.

In this way, the scan wiring S may be formed as multiple conductive layers so that the resistance of the scan wiring S may be reduced, and the second conductive layer 516 may be disposed far away from the opposite electrode 20 so that the parasitic capacitance may be reduced.

The organic light emitting display device according to the present invention as described above forms a wiring as double conductive layers so that the resistance of the wiring may be reduced.

In addition, even though the wiring may be formed as double conductive layers, a maximum distance between the conductive layer and the opposite electrode is guaranteed so that an increase in the parasitic capacitance may be suppressed.

Thus, a load of the wiring is reduced so that a large organic light emitting display device may be implemented.

Although the second opening H of the gate insulating layer 13 and the second opening H of the interlayer insulating layer 13 have the same sizes, aspects of the present invention are not limited thereto. The size of the second opening H of the interlayer insulating layer 13 may be less than the size of the second opening H of the gate insulating layer 13. In addition, the second opening H may be formed only on the interlayer insulating layer 13 and may not be formed on the gate insulating layer 13.

The above-described wiring structure may be applied to a data wiring in addition to the scan wiring.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
   a plurality of first wirings extending in a first direction; and
   a plurality of second wirings extending in a second direction that crosses the first direction,
   wherein at least one of the plurality of first wirings comprises
      a first conductive layer and
      a second conductive layer that extends from an upper portion of the first conductive layer to have a depressed region at the same layer level as the first conductive layer or a lower layer level than the first conductive layer, an interlayer insulating layer is sandwiched between the first conductive layer and the second conductive layer, and
   wherein the plurality of first wirings supply a scan signal to pixels of the organic light emitting display device.

2. The organic light emitting display device of claim 1, wherein the first wirings and the second wirings cross one another to define a plurality of pixels, and
   each of the plurality of pixels comprises
      an organic light emitting device (OLED) comprising
         a pixel electrode,
         an intermediate layer comprising an organic emission layer, and
         an opposite electrode and
      a switching device comprising
         a gate electrode and
         source and drain electrodes, and
   the second conductive layer extends from the upper portion of the first conductive layer to a direction in which the second conductive layer is far away from the opposite electrode.

3. The organic light emitting display device of claim 2, wherein, as the second conductive layer gets farther away from the first conductive layer, the second conductive layer extends to be far away from the opposite electrode.

4. The organic light emitting display device of claim 2, wherein the first wirings are scan wirings that supply a scan signal to the pixels.

5. The organic light emitting display device of claim 1, further comprising:
   a substrate; and
   a buffer layer disposed on the substrate,
   wherein the first wirings and the second wirings are formed on the buffer layer.

6. The organic light emitting display device of claim 5, wherein parts of the second conductive layer are formed on the buffer layer.

7. The organic light emitting display device of claim 5, further comprising a first insulating layer formed between the buffer layer and the first conductive layer.

8. The organic light emitting display device of claim 7, wherein a first opening is formed on the first insulating layer so that part of the second conductive layer contacts the buffer layer.

9. The organic light emitting display device of claim 5, further comprising:
   a second insulating layer disposed on the first insulating layer and covering the first conductive layer.

10. The organic light emitting display device of claim 9, wherein a second opening is formed on the second insulating layer so that part of the second conductive layer contacts the buffer layer or the first insulating layer.

11. The organic light emitting display device of claim 9, wherein the first conductive layer and the second conductive layer are connected to each other via a contact hole formed in the second insulating layer.

12. The organic light emitting display device of claim 5, wherein the second conductive layer is disposed on the buffer layer by covering part of the first conductive layer.

13. The organic light emitting display device of claim 2, wherein the first conductive layer is formed as the same layer as the gate electrode.

14. The organic light emitting display device of claim 2, wherein the first conductive layer is formed of the same material as material used in forming the gate electrode.

15. The organic light emitting display device of claim 2, wherein the second conductive layer is formed of the same material as material used in forming the source and drain electrodes.

16. The organic light emitting display device of claim 1, wherein the first conductive layer comprises a plurality of sub-conductive layers that are formed to be spaced apart from each other by a predetermined distance.

17. The organic light emitting display device of claim 16, wherein each of the plurality of sub-conductive layers is connected to the second conductive layer.

18. The organic light emitting display device of claim 16, wherein the second conductive layer covers part of each sub-conductive layer.

19. The organic light emitting display device of claim 15, wherein the second conductive layer formed between the plurality of sub-conductive layers is disposed on the same layer as the plurality of sub-conductive layers or a lower layer than the plurality of sub-conductive layers.

20. An organic light emitting display device comprising:
   a plurality of pixels comprising an organic light emitting device (OLED) comprising a pixel electrode, an intermediate layer comprising an organic emission layer, and an opposite electrode and a switching device comprising a gate electrode and source and drain electrodes;
   a plurality of scan wirings connected to each of the plurality of pixels and supplying scan signals to the plurality of pixels; and
   a plurality of data wirings connected to each of the plurality of pixels and supplying data signals to the plurality of pixels,
   wherein at least one of the scan wirings comprises
      a first conductive layer and
      a second conductive layer that extends from an upper portion of the first conductive layer to a direction so as to have a depressed region in which the second conductive layer is far away from the opposite electrode relative to the first conductive layer, an interlayer insulating layer is sandwiched between the first conductive layer and the second conductive layer.

* * * * *